US009966315B2

(12) United States Patent
Jaschinsky et al.

(10) Patent No.: US 9,966,315 B2
(45) Date of Patent: May 8, 2018

(54) ADVANCED PROCESS CONTROL METHODS FOR PROCESS-AWARE DIMENSION TARGETING

(71) Applicant: GLOBALFOUNDRIES INC., Grand Cayman (KY)

(72) Inventors: Philipp Jaschinsky, Dresden (DE); Frank Kahlenberg, Dresden (DE); Sirko Kramp, Langebrück (DE); Roberto Schiwon, Dresden (DE); Rolf Seltmann, Radebeul (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 35 days.

(21) Appl. No.: 15/201,771

(22) Filed: Jul. 5, 2016

(65) Prior Publication Data

US 2018/0012813 A1    Jan. 11, 2018

(51) Int. Cl.
| | |
|---|---|
| *G03F 7/20* | (2006.01) |
| *G06F 17/50* | (2006.01) |
| *G06F 19/00* | (2018.01) |
| *H01L 21/66* | (2006.01) |
| *H01L 21/302* | (2006.01) |
| *G01B 11/14* | (2006.01) |
| *G06F 17/30* | (2006.01) |
| *G05B 19/042* | (2006.01) |
| *G05B 17/02* | (2006.01) |
| *G03F 1/70* | (2012.01) |
| *H01L 21/027* | (2006.01) |

(Continued)

(52) U.S. Cl.
CPC ............ *H01L 22/20* (2013.01); *G03F 1/70* (2013.01); *G03F 7/20* (2013.01); *G05B 17/02* (2013.01); *G05B 19/0426* (2013.01); *G06F 17/30424* (2013.01); *H01L 21/0274* (2013.01); *H01L 21/308* (2013.01); *H01L 21/30604* (2013.01)

(58) Field of Classification Search
CPC .............................. H01L 22/12; H01L 22/20
See application file for complete search history.

(56) References Cited

U.S. PATENT DOCUMENTS

| | | |
|---|---|---|
| 5,283,141 A | 2/1994 | Yoon et al. |
| 6,263,255 B1 | 7/2001 | Tan et al. |

(Continued)

*Primary Examiner* — Victor A Mandala
*Assistant Examiner* — Regan J Rundio
(74) *Attorney, Agent, or Firm* — Gibb & Riley, LLC; Yuanmin Cai, Esq.

(57) ABSTRACT

Disclosed are methods of advanced process control (APC) for particular processes. A particular process (e.g., a photolithography or etch process) is performed on a wafer to create a pattern of features. A parameter is measured on a target feature and the value of the parameter is used for APC. However, instead of performing APC based directly on the actual parameter value, APC is performed based on an adjusted parameter value. Specifically, an offset amount (which is previously determined based on an average of a distribution of parameter values across all of the features) is applied to the actual parameter value to acquire an adjusted parameter value, which better represents the majority of features in the pattern. Performing this APC method minimizes dimension variations from pattern to pattern each time the same pattern is generated on another region of the same wafer or on a different wafer using the particular process.

17 Claims, 7 Drawing Sheets

(51) Int. Cl.
*H01L 21/306* (2006.01)
*H01L 21/308* (2006.01)

(56) References Cited

U.S. PATENT DOCUMENTS

| | | |
|---|---|---|
| 6,815,345 B2 | 11/2004 | Zhao et al. |
| 7,738,075 B2 | 6/2010 | Hiar et al. |
| 8,530,247 B2 * | 9/2013 | Reid .................. H01L 22/12 257/E21.027 |
| 2004/0044431 A1 | 3/2004 | Pellegrini et al. |
| 2010/0161103 A1 | 6/2010 | Schaller et al. |
| 2011/0205520 A1 | 8/2011 | Padiy et al. |
| 2012/0008127 A1 | 1/2012 | Tel et al. |
| 2013/0110276 A1 | 5/2013 | Cheng et al. |
| 2013/0149800 A1 | 6/2013 | Kiermasz |
| 2015/0079700 A1 | 3/2015 | Ke et al. |

\* cited by examiner

PHOTOLITHOGRAPHY PROCESS OFFSET DATABASE

| Feature Identifier | Offset Amount |
|---|---|
| 1 | |
| 2 | |
| 3 | |
| . . . | |
| 36 | |

ETCH PROCESS OFFSET DATABASE

| Feature Identifier | Offset Amount |
|---|---|
| 1 | |
| 2 | |
| 3 | |
| . . . | |
| 36 | |

ADVANCED PROCESS CONTROL METHODS FOR PROCESS-AWARE DIMENSION TARGETING

FIELD OF THE INVENTION

The present invention relates to advanced process control (APC) and, particularly, to methods of advanced process control (APC) for particular processes in order to minimize dimension variations.

BACKGROUND

In semiconductor wafer processing, advanced process control (APC) refers to the selective adjustment of one or more process specifications for a particular process based on feedback in order to achieve a target parameter value in each of multiple instances of the same feature in a pattern when the particular process is repeated on the same semiconductor wafer or a different semiconductor wafer. For example, APC can be performed for a particular process (e.g., a photolithography process or an etch process) used to form a patterned region with a pattern of features (e.g., 200+ features) on a semiconductor wafer. Specifically, APC can be performed in an attempt to achieve a target parameter value in each of the features. The target parameter value can be, for example, a critical dimension. For purposes of this disclosure, the term "critical dimension" refers to a minimum size of a feature (e.g., a minimum width of a feature).

Generally, APC involves performing the particular process according to an initial set of process specifications. If a determination is made that a target feature (i.e., a selected one of the features from the pattern) does not have the target parameter value, then at least one of the process specifications is adjusted for use when the particular process is subsequently repeated to form the same patterned region elsewhere on the same semiconductor wafer or on another semiconductor wafer. However, the actual parameter value of a single target feature selected from amongst all of multiple features (e.g., 200+ features) in the patterned region may not be representative of the majority of the features. For example, the actual parameter value for a single target feature may be relatively small or large as compared to the parameter values of other features in the patterned region. As a result, process specification adjustments made based on that actual parameter value of the target feature may result in an overcorrection. For example, if the target feature is relatively small, adjustments made to a process specification based on that target feature could result in subsequently patterned features being too large, whereas if the target feature is relatively large, adjustments made to the same process specification based on that target feature could result in subsequently patterned features being too small.

One technique that has been used in an attempt to avoid such an overcorrection is to make the adjustments to the process specification(s) based on an average of the measurements taken from a sample of target features (e.g., 2-5 target features) selected from the pattern. Unfortunately, the average of such a small sample, when the total number of features is high (e.g., in the hundreds), also may not be representative of the majority of the features such that process specification adjustments made based on that average may not be optimal.

SUMMARY

In view of the foregoing, disclosed herein are methods of advanced process control (APC) for particular processes. In these methods, a particular process (e.g., a photolithography process, an etch process, etc.) can be performed on a semiconductor wafer according to an initial set of process specifications in order to create a pattern of features. A parameter of interest can be measured on a target feature selected from amongst the features in the pattern and the value of the parameter can be used for APC (i.e., for adjusting in-line process controls). However, instead of performing APC based directly on the actual parameter value, APC can be performed using an adjusted parameter value. Specifically, an offset amount can be applied to the actual parameter value of the target feature in order to acquire an adjusted parameter value. This offset amount can be an amount previously determined based on an average of a known distribution of parameter values across all of the features in the pattern such that the adjusted parameter value better represents the majority of features in the pattern. Performing APC using such an adjusted parameter value effectively minimizes dimension variations between patterns (i.e., from pattern to pattern each time the same pattern is generated on another region of the same semiconductor wafer or on a different semiconductor wafer using the particular process).

Generally, disclosed herein are methods of advanced process control (APC) for any particular process, which can be used to create a pattern of features. In the methods, the particular process can be performed on a semiconductor wafer. The particular process can be performed according to an initial set of process specifications in order to form a patterned region with a pattern of features. A single feature (referred to as a target feature) can be selected from amongst all the features in the pattern and a parameter of that target feature can be measured to acquire an actual parameter value. Once the actual parameter value of the target feature is found, an offset database can be accessed to acquire an offset amount, which is associated with the target feature in the offset database. The offset amount associated with the target feature can be applied to the actual parameter value in order to acquire an adjusted parameter value. This adjusted parameter value can subsequently be compared to a target parameter value for the features. For purposes of this disclosure, the term "target parameter value" refers to a design goal for the features in the pattern and, more particularly, is a desired value for the parameter at issue in all of the multiple instances of the same feature in the pattern. The target parameter value can be, for example, a design-specified value for a critical dimension (e.g., a design-specified minimum width) for the features in the pattern. Depending upon the difference between the two values, APC can be performed. That is, depending upon the difference between the adjusted parameter value and the target parameter value, at least one of the process specifications in the initial set of process specifications can be adjusted in order to generate an adjusted set of process specifications. This adjusted set of process specifications can subsequently be used when the same particular process is repeated on another region of the semiconductor wafer or on another semiconductor wafer.

APC, as described above, can be used for various different processes including, but not limited to, photolithography and etch processes. For example, disclosed herein is a method of APC for a particular photolithography process. In this method, a particular photolithography process can be formed on a semiconductor wafer. This photolithography process can be performed using a specific reticle and according to an initial set of photolithography specifications in order to form, from a photoresist layer, a mask with a pattern of features. A single feature (referred to as a target feature)

can be selected from amongst all the features in the pattern and a parameter of that target feature can be measured to acquire an actual parameter value. Once the actual parameter value of the target feature is found, a photolithography process offset database can be accessed to acquire an offset amount, which is associated with the target feature in the photolithography process offset database. This offset amount can be applied to the actual parameter value to acquire an adjusted parameter value. This adjusted parameter value can subsequently be compared to a target parameter value for the features. For purposes of this disclosure, the term "target parameter value" refers to a design goal for the features in the pattern and, more particularly, is a desired value for the parameter at issue in all of the multiple instances of the same feature in the pattern. The target parameter value can be, for example, a design-specified value for a critical dimension (e.g., a design-specified minimum width) for the features in the pattern. Depending upon the difference between the two values, APC can be performed. That is, depending upon the difference between the adjusted parameter value and the target parameter value, at least one of the photolithography specifications in the initial set of photolithography specifications can be adjusted in order to generate an adjusted set of photolithography specifications. This adjusted set of photolithography specifications can subsequently be used when the same photolithography process using the same specific reticle is repeated on another region of the semiconductor wafer or on another semiconductor wafer.

Also disclosed herein is a method of APC for a particular etch process. This method of APC for a particular etch process can be a follow-on method to the above-described method of APC for a particular photolithography process or a standalone method. In any case, in this method, a particular etch process can be performed on a semiconductor wafer. This particular etch process can be performed according to an initial set of etch specifications and using a specific mask, which has a pattern of features and which was previously formed using a specific reticle. Specifically, this particular etch process can be performed so as to transfer the pattern of features from the specific mask into a region of the semiconductor wafer below the specific mask in order to form a patterned region with a second pattern of second features. A single second feature (referred to as a target second feature) can be selected from amongst all the second features in the second pattern and a parameter of that target second feature can be measured to acquire an actual parameter value. Once the actual parameter value of the target second feature is found, an etch process offset database can be accessed to acquire an offset amount, which is associated with the target second feature in the etch process offset database. This offset amount can be applied to the actual parameter value to acquire an adjusted parameter value. This adjusted parameter value can subsequently be compared to a target parameter value for the features. For purposes of this disclosure, the term "target parameter value" refers to a design goal for the features in the pattern and, more particularly, is a desired value for the parameter at issue in all of the multiple instances of the same feature in the pattern. The target parameter value can be, for example, a design-specified value for a critical dimension (e.g., a design-specified minimum width) for the features in the pattern. Depending upon the difference between the two values, APC can be performed. That is, depending upon the difference between the adjusted parameter value and the target parameter value, at least one of the etch specifications in the initial set of etch specifications can be adjusted in order to generate an adjusted set of etch specifications. This adjusted set of etch specifications can subsequently be used when the same etch process is repeated on another region of the semiconductor wafer or on another semiconductor wafer.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, in semiconductor wafer processing, advanced process control (APC) refers to the selective adjustment of one or more process specifications for a particular process based on feedback in order to achieve a target parameter value in each of multiple instances of the same feature in a pattern when the particular process is repeated on the same semiconductor wafer or a different semiconductor wafer. For example, APC can be performed for a particular process (e.g., a photolithography process or an etch process) used to form a patterned region with a pattern of features (e.g., 200+ features) on a semiconductor wafer. Specifically, APC can be performed in an attempt to achieve a target parameter value in each of the features. The target parameter value can be, for example, a critical dimension. For purposes of this disclosure, the term "critical dimension" refers to a minimum size of a feature (e.g., a minimum width of a feature).

Generally, APC involves performing the particular process according to an initial set of process specifications. If a determination is made that a target feature (i.e., a selected one of the features from the pattern) does not have the target parameter value, then at least one of the process specifications is adjusted for use when the particular process is subsequently repeated to form the same patterned region elsewhere on the same semiconductor wafer or on another semiconductor wafer. However, the actual parameter value of a single target feature selected from amongst all of multiple features (e.g., 200+ features) in the patterned region may not be representative of the majority of the features. For example, the actual parameter value for a single target feature may be relatively small or large as compared to the parameter values of other features in the patterned region. As a result, process specification adjustments made based on that actual parameter value of the target feature may result in an overcorrection. For example, if the target feature is relatively small, adjustments made to a process specification based on that target feature could result in subsequently patterned features being too large, whereas if the target feature is relatively large, adjustments made to the same process specification based on that target feature could result in subsequently patterned features being too small.

One technique that has been used in an attempt to avoid such an overcorrection is to make the adjustments to the process specification(s) based on an average of the measurements taken from a sample of target features (e.g., 2-5 target features) selected from the pattern. Unfortunately, the average of such a small sample, when the total number of features is high (e.g., in the hundreds), also may not be representative of the majority of the features such that process specification adjustments made based on that average may not be optimal.

In view of the foregoing, disclosed herein are methods of advanced process control (APC) for particular processes. In these methods, a particular process (e.g., a photolithography process, an etch process, etc.) can be performed on a semiconductor wafer according to an initial set of process specifications in order to create a pattern of features. A parameter of interest can be measured on a target feature selected from amongst the features in the pattern and the value of the parameter can be used for APC (i.e., for adjusting in-line process controls). However, instead of performing APC based directly on the actual parameter value, APC can be performed using an adjusted parameter value. Specifically, an offset amount can be applied to the actual parameter value of the target feature in order to acquire an adjusted parameter value. This offset amount can be an amount previously determined based on an average of a known distribution of parameter values across all of the features in the pattern such that the adjusted parameter value better represents the majority of features in the pattern. Performing APC using such an adjusted parameter value effectively minimizes dimension variations between patterns (i.e., from pattern to pattern each time the same pattern is generated on another region of the same semiconductor wafer or on a different semiconductor wafer using a particular process).

Figure 1:
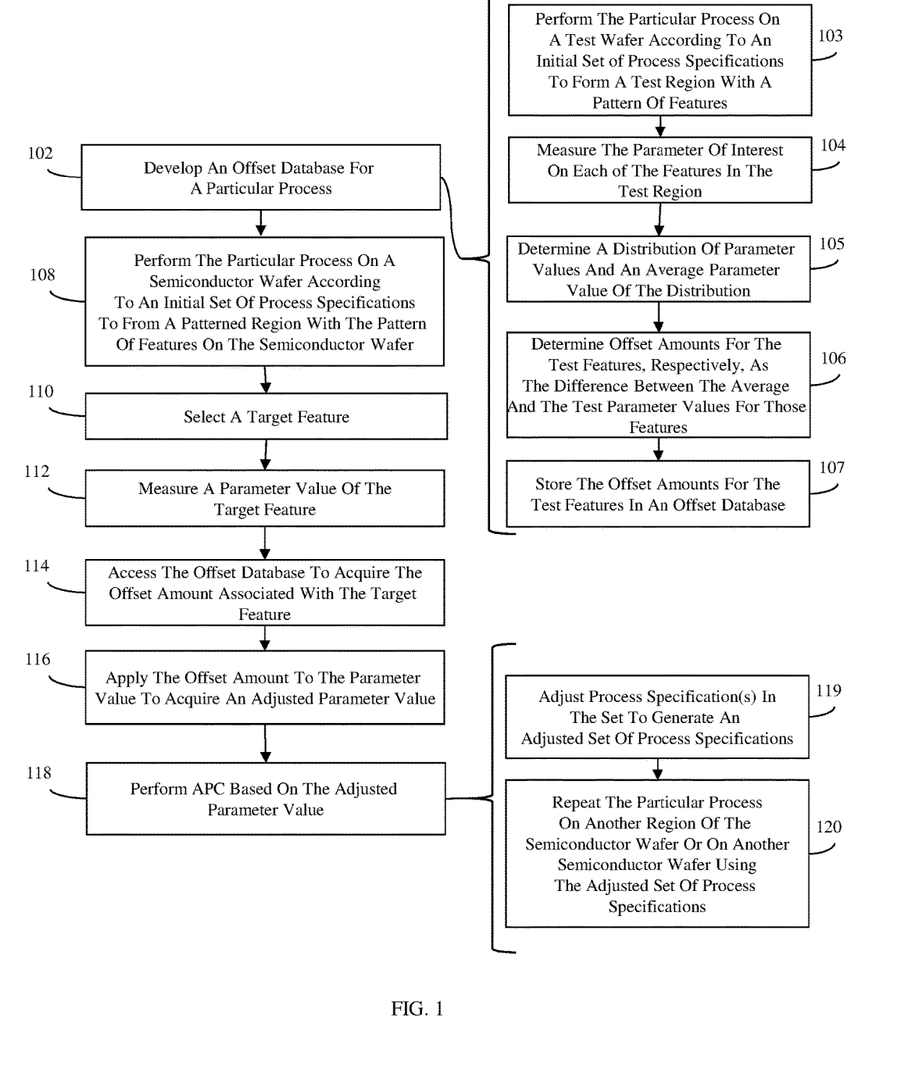
FIG. 1 is a flow diagram illustrating disclosed methods of advanced process control (APC) for particular processes.

Referring to the flow diagram of FIG. 1, disclosed herein are methods of advanced process control (APC) for particular processes. As described in greater detail below, the particular processes can be a photolithography process, an etch process or any other particular process that forms, on a semiconductor wafer, a patterned region with a pattern of features (also referred to herein as a pattern of shapes) and that has a unique signature (also referred to herein as a fingerprint) because of the use of a specific reticle, mask, product, platform, etc. In any case, such APC methods can be used in order to minimize dimension variations between patterns of the particular process (i.e., such APC methods can be used for process-aware dimension targeting).

In the methods, an offset database for the particular process can be developed (102). To develop such an offset database, the particular process can be performed on a test wafer according to the initial set of process specifications, thereby forming a test region with the pattern of features (103). Then, a parameter at issue can be measured on each of the features in the pattern in the test region in order to acquire test parameter values for all of those features (104). The parameter at issue can be, for example, a dimension (e.g., width, depth, height, etc.). The dimension can, for example, be a critical dimension such as a minimum feature size (e.g., minimum width). The test parameter values can be the measured values of this dimension on each of the features in the pattern. Based on the test parameter values, a distribution of parameter values across all the features in the pattern, as well as an average parameter value for this distribution, can be determined (105). For purposes of this disclosure, the term "average" refers to any statistical central tendency value, such as a mean, median or mode. Offset amounts for each of the features in the pattern can be determined as the differences between the average parameter value for the distribution and the test parameter values for those features, respectively (106). Thus, the offset amount for a given feature will be a negative amount, if the average parameter value for the distribution is less than the test parameter value for that given feature; whereas, the offset amount for a given feature will be a positive amount, if the average parameter value for the distribution is greater than the test parameter value for that given feature. Alternatively, the above-described processes can be performed with respect to multiple test regions (e.g., 2, 3, 4, etc.). In this case, a feature-specific average test parameter value can be found for each feature based on test parameter values acquired for that feature in the different test regions; an overall distribution of parameter values, as well as an average parameter value for the overall distribution, can be determined based on the feature-specific average test parameter values for all of the features; and the offset amounts can be determined as the differences between the average parameter value for the overall distribution and the feature-specific average test parameter values for the features, respectively. The offset amounts for each of the features can be stored in an offset database that is associated with the particular process and that resides, for example, in a memory accessible by a processor of a computer system (107). Specifically, this offset database can list the features by identifiers (e.g., by numbers, by location coordinates in the region, or by other suitable identifiers) and can indicate the corresponding offset amount for each feature. Such an offset database can be accessible for use in APC control for the particular process, as described below.

For example, in the methods, manufacture of semiconductor wafers according to a given design can be initiated and can require performance of the particular process. Thus, following development of the offset database, the particular process can be performed on a semiconductor wafer (108). That is, the particular process can be performed according to the same initial set of process specifications used to develop the offset database and can result in the formation, on a semiconductor wafer, of a patterned region with the same pattern of features.

Once the patterned region is formed on a semiconductor wafer, a single feature (referred to as a target feature) can be selected from amongst all of the features in the pattern (110) and the parameter of interest can be measured from that target feature in order to acquire an actual parameter value (112). Once the actual parameter value of the target feature is found, the offset database can be accessed to acquire the offset amount, which is associated with the target feature in the offset database (114). This offset amount can be applied to (i.e., added to) the actual parameter value in order to acquire an adjusted parameter value (116). Thus, for a given feature, if the offset amount is a negative amount, it will reduce the parameter value and, if the offset amount is a positive amount, it will increase the parameter value.

The adjusted parameter value acquired at process 116 can subsequently be compared to a target parameter value for the features (118). For purposes of this disclosure, the term "target parameter value" refers to a design goal for the features in the pattern and, more particularly, is a desired value for the parameter at issue in all of the multiple instances of the same feature in the pattern. Typically, this design goal is set to ensure optimum performance and/or to avoid fails in the integrated circuit structures being formed. The target parameter value can be, for example, a design-specified value for a critical dimension (e.g., a design-specified minimum width) for the features in the pattern. Depending upon the difference between the two values, APC can be performed. That is, depending upon the difference between the adjusted parameter value for the target feature and the target parameter value for all of the features, at least one of the process specifications in the initial set of process specifications can be adjusted in order to generate an adjusted set of process specifications (119). This adjusted set of process specifications can subsequently be used when the same particular process is repeated on another region of the semiconductor wafer or on another semiconductor wafer (120).

It should be understood that the purpose of APC and, particularly, the purpose of adjusting the process specification(s) at process 119 is so that, when this particular process is repeated at process 120, the parameter at issue will be increased or decreased across the process field, as necessary, to ensure that actual parameter values for at least the majority of features patterned on the semiconductor wafer approach the target parameter value. Furthermore, since the offset amount of the target feature is predetermined based on the average parameter value for the distribution of parameter values of all of the features in the pattern, the adjusted parameter value better represents this majority. As a result, the APC method disclosed herein minimizes overcorrections and, thereby effectively minimizes dimension variations when the particular process is repeated at process 120. That is, this APC method can be used in order to minimize dimension variations from pattern to pattern each time the same pattern is generated on another region of the same semiconductor wafer or on a different semiconductor wafer using the particular process.

Figure 2:
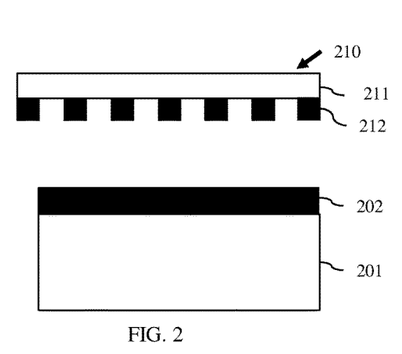
FIG. 2 illustrates an exemplary reticle positioned to pattern a photoresist layer on a semiconductor wafer during a photolithography process.

The above-described APC method can be used for various different processes including, but not limited to, photolithography and etch processes. More specifically, photolithography processes generally begin with the formation of a photoresist layer 202 (also referred to herein as a photosensitive layer) on a semiconductor wafer 201 and the formation of a specific reticle 210, as shown in FIG. 2. It should be understood that the photoresist layer 202 may be a positive tone photoresist (i.e., it may be a type of photoresist where portions exposed to light become soluble in a photoresist developer and, thereby selectively removable). Alternatively, the photoresist layer 202 may be a negative tone photoresist (i.e., it may be a type of photoresist where exposed to light become insoluble in a photoresist developer, thereby allowing the unexposed portions to be selectively removed). It should be understood that the photoresist layer 202 can be formed at various stages of semiconductor wafer processing (e.g., during front end of the line process, middle of the line processing and back end of the line processing) depending upon the design level being patterned. Thus, photoresist layer 202 may be formed immediately adjacent to a semiconductor substrate or immediately adjacent to any one of multiple layers above the semiconductor substrate. Additionally, it should also be understood that, depending upon the type of photolithography being performed, the configuration of the specific reticle 210 may vary. For example, those skilled in the art will recognize that for conventional photolithography (e.g., wherein light from a light source is transmitted through light transmissive areas of the specific reticle 210), the specific reticle 210 may incorporate a light transmissive layer 211 (e.g., a glass layer) and a patterned light blocking layer 212 (e.g., a patterned chromium layer) on the light transmissive layer 211, as illustrated in FIG. 2. However, for extreme ultraviolet (EUV) photolithography (e.g., wherein light from a light source is reflected off of light reflective areas on the specific reticle), the specific reticle may incorporate a combination of light reflecting and light absorbing materials (not shown).

Figure 3:
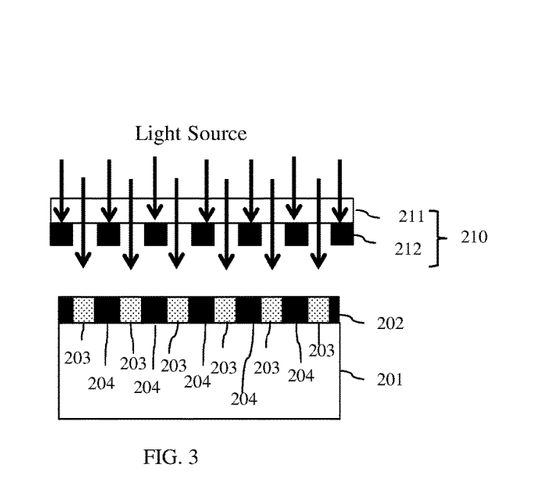
FIG. 3 illustrates transmission of light from a light source through the exemplary reticle of FIG. 2 to the photoresist layer during the photolithography process.

In any case, the specific reticle 210 can be placed relative to a light source and to the photoresist layer 202 so that portions of the photoresist layer 202 can be exposed to a pattern of light, which is either transmitted through the specific reticle 210 in the case of conventional photolithography, as shown in FIG. 3, or reflected off of the specific reticle in the case of EUV photolithography (not shown). This pattern of light can cause a chemical change in the exposed areas 203 of the photoresist layer 202 as compared to unexposed areas 204, also as shown in FIG. 3. As mentioned above, this chemical change will make the exposed areas either soluble (e.g., in a positive tone photoresist) or insoluble (e.g., in a negative tone photoresist).

Figure 4A:
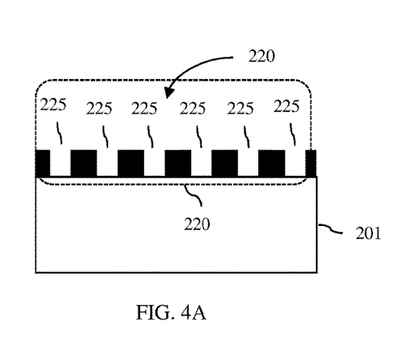
FIGS. 4A-4B illustrate the photoresist layer, as patterned, following selective removal of exposed areas.
Figure 4B:
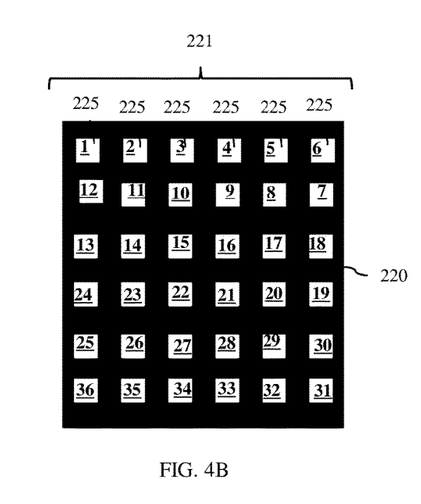

Subsequently, a development process can be performed. During this development process, a solution (e.g., sodium hydroxide (NaOH), tetramethylammonium hydroxide (TMAH) or other suitable solution) can be applied to the photoresist layer 202 in order to selectively remove either the exposed areas 203 of a positive tone photoresist (e.g., as shown in FIG. 4A) or the unexposed areas 204 of a negative tone photoresist (not shown). As a result, a mask 220 is formed on the semiconductor wafer 201 and this mask 220 has a pattern 221 of features 225, as shown in FIGS. 4A-4B. For purposes of illustration, the patterned features in the mask 220 are shown as holes (i.e., openings, such as contact openings) in the photoresist layer resulting from removal of the exposed areas 203 and there are thirty-six instances of such holes identified as features 1-36 in FIG. 4B. It should be understood that FIGS. 4A-4B are not intended to be limiting. For example, the features could be any other type of feature (e.g., trenches, fins, pillars, etc.) with any other shape. Furthermore, the pattern could have any number of features ranging from 2 to 200 or more.

Those skilled in the art will recognize that oftentimes the same specific reticle can be used to expose different process fields (i.e., multiple different regions) on the same semiconductor wafer (e.g., 2, 4, 6, 8, etc. process fields on the same semiconductor wafer) and also one or more process fields on other semiconductor wafers. Thus, the semiconductor wafer 201 shown in FIGS. 2-4A could represent an entire semiconductor wafer or, alternatively, could represent only a portion of such a semiconductor wafer.

Figure 5:
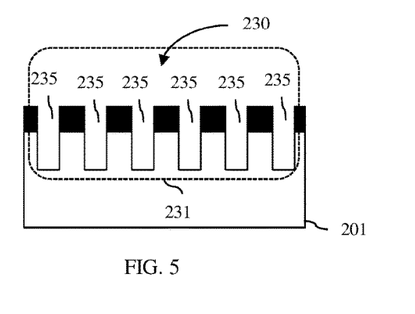
FIG. 5 illustrates an etch process performed using the patterned photoresist layer of FIGS. 4A-4B.

Typically, an etch process will follow the above-described photolithography process. For example, a wet etch process, a dry etch process or any other suitable etch process can be performed following the above-described photolithography process in order to transfer the pattern 221 of features 225 from the mask 220 into a region of the semiconductor wafer 201 below the mask 220, thereby forming, on the semiconductor wafer, a patterned region 230 with a second pattern 231 of second features 235, as shown in FIG. 5.

In the particular photolithography process described above, an initial set of photolithography specifications can be established by designers with at least one goal being the achievement of a target parameter value in all of the features 225 across the pattern 221 with minimal variation. Similarly, in the particular etch process described above, an initial set of etch specifications can be established by the designers with at least one goal being the achievement of a target parameter value in all of the features 235 across the pattern 231 with minimal variation. In either case, the target parameter value can be, for example, a design-specified value for a critical dimension (e.g., a design-specified minimum width) for the features in the pattern. It should be understood that, although the patterned features 225 and the pattern features 235 are illustrated in FIG. 5 as having essentially the same width, the target parameter value for the patterned features 225 created by the particular photolithography process may be either the same as the target parameter value for the patterned features 235 created by the etch process or different from (e.g., smaller or larger than) the target parameter value for the patterned features 235 created by the etch process. To ensure that the target parameter values for the features 225 and/or 235 are met with minimal variations when the particular photolithography and etch processes are repeated on different regions of the semiconductor wafer 201 and/or on other semiconductor wafers, APC can be performed with respect to each of the processes according to methods disclosed herein and described in greater detail below.

Figure 6:
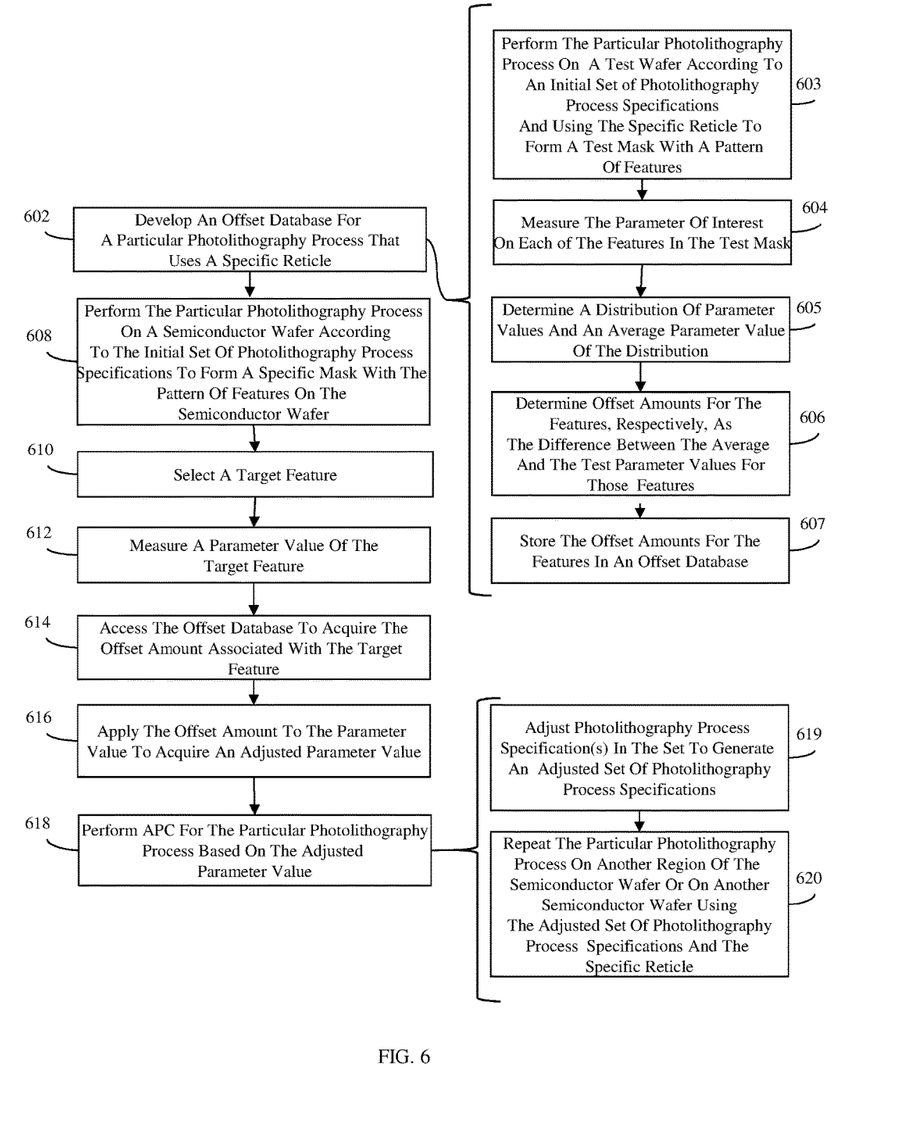
FIG. 6 is a flow diagram illustrating a disclosed method of advanced process control (APC) for a particular photolithography process.

Specifically, referring to FIG. 6, disclosed herein is a method of APC for a particular photolithography process. In this method, a photolithography process offset database can be developed (602).

Figure 7:
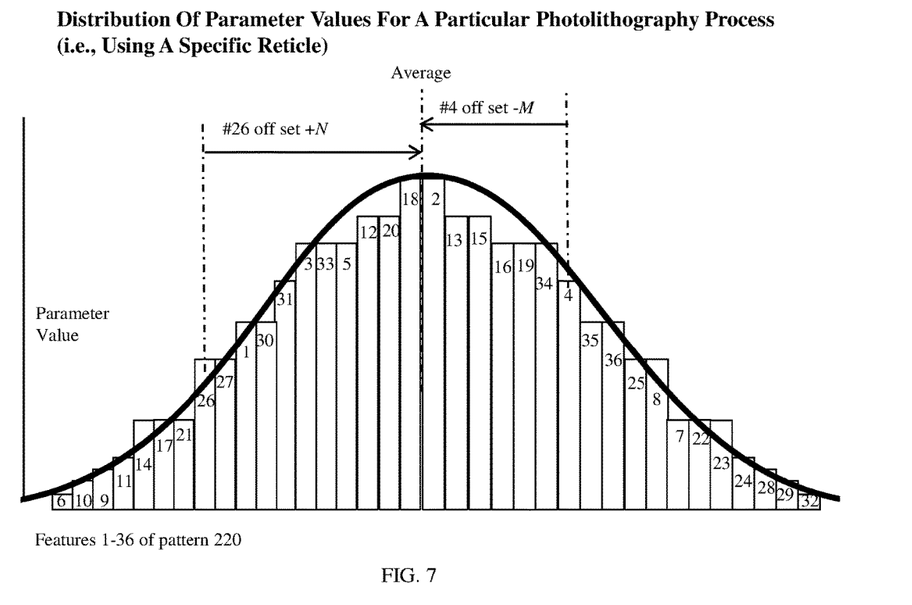
FIG. 7 is a graph illustrating a distribution of parameter values for the particular photolithography process as an average parameter value for the distribution.

This offset database can be determined at the wafer-level. That is, to develop the offset database, the particular photolithography process can, for example, be performed on a test wafer according to an initial set of photolithography process specifications (including, but not limited to, specifications for exposure energy, exposure wavelength and lens aperture) and using the specific reticle 210 so as to form, from a test photoresist layer, a test mask with the same pattern 221 of features 225, as shown in FIGS. 4A-4B (603). Then, the parameter at issue can be measured on each of the features of the test mask in order to acquire test parameter values for all of the features (i.e., from features 1-36) (604). The parameter at issue can be, for example, a dimension (e.g., width, depth, height, etc.). The dimension can, for example, be a critical dimension such as a minimum feature size (e.g., minimum width). The test parameter values can be the measured values of this dimension on each of the features in the pattern. Based on the test parameter values, a distribution of parameter values for all the features in the pattern, as well as an average parameter value for this distribution, can be determined, as shown in FIG. 7 (605). As mentioned above, for purposes of this disclosure the term "average" refers to any statistical central tendency values, such as a mean, median or mode. Offset amounts for each of the features in the pattern (which was created by the particular photolithography process using the specific reticle) can be determined as the differences between the average parameter value for the distribution and the test parameter values for those features, respectively (606). Thus, the offset amount will be a negative amount, when the average parameter value for the distribution is less than the test parameter value (e.g., see the −M offset for feature #4) and, the offset amount will be a positive amount, when the average parameter value for the distribution is greater than the test parameter value (e.g., see the +N offset for feature #26). Alternatively, the above-described processes can be performed with respect to multiple test regions (e.g., 2, 3, 4, etc.). In this case, a feature-specific average test parameter value can be found for each feature 1-36 across the different test regions; an overall distribution of parameter values for all of the features, as well as an average parameter value for the overall distribution, can be determined based on these feature-specific average test parameter values for the features; and the offset amounts can be determined as the differences between the average parameter value for the overall distribution and the feature-specific average test parameter values for the features, respectively.

Alternatively, the offset database can be determined at the mask level. Specifically, a distribution of the parameter values can be determined immediately following writing of the specific reticle. This mask-level distribution can then be translated into wafer-level distribution. That is, the mask-level distribution can be used to predict the wafer-level distribution. The offset amounts can then be determined in the same manner as described above.

Figure 8:
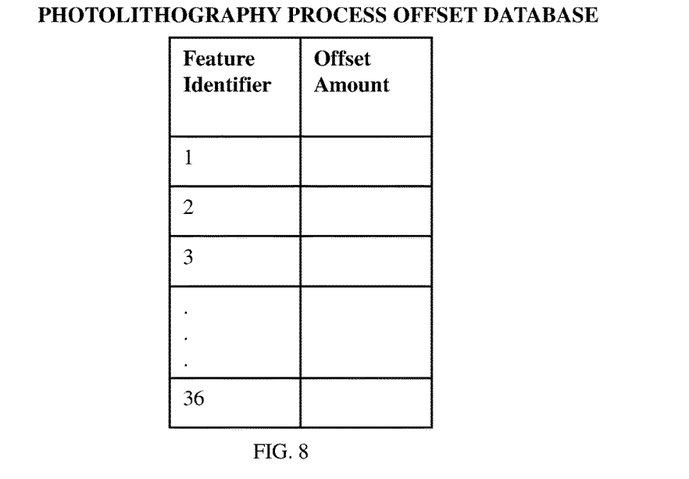
FIG. 8 is a table showing a photolithography process offset database.

The offset amounts for each of the features in the pattern (which was created by the particular photolithography process using the specific reticle) can be stored in a photolithography process offset that resides, for example, in a memory accessible by a processor of a computer system (607). As illustrated in FIG. 8, this photolithography process offset database can list the features by identifiers (e.g., by number, by coordinates associated with the process field or other suitable identifiers) and can indicate the corresponding offset amount for each feature.

Such an offset database can be accessible for use in APC control for the particular photolithography process, as described below.

That is, manufacture of semiconductor wafers according to a given design can be initiated and can require performance of the particular photolithography process (608). Specifically, the particular photolithography process can be performed using the same initial set of process specifications (including, but not limited to, the same specifications for exposure energy, exposure wavelength and lens aperture) and the same specific reticle 210, which were previously used to develop the photolithography process offset database. This particular photolithography process can result in the formation, on the semiconductor wafer, of a specific mask with the same pattern of features.

Once the specific mask is formed on the semiconductor wafer, a single feature (referred to as a target feature) can be selected from amongst all the features in the pattern on the specific mask (610). For example, referring to FIGS. 4B and 7, the target feature can be feature #26, feature #24 or any other one of the features in the pattern 221. Next, the parameter of interest can be measured from the target feature in order to acquire an actual parameter value (612). As illustrated in FIG. 7, the test parameter value of features #26 and #4 were significantly different from the average parameter value. Thus, if APC was performed based on the actual parameter value measured from either of these features, overcorrection would occur in a significant number of the features. Specifically, feature #4 is relatively large and feature #26 is relatively small and, thus, neither of these features are representative of the majority of the features. If one or more of the photolithography process specification(s)

were adjusted during APC to decrease the feature size based on the actual parameter measured from feature #4, significant overcorrection would occur in the other features, resulting in a majority of the features being too small. Contrarily, if one or more of the photolithography process specification(s) were adjusted during APC to increase the feature size based on the actual parameter measured from feature #26, significant overcorrection would occur in the other features, resulting in a majority of the features being too large. Therefore, in the method disclosed herein, once the actual parameter value of the target feature is found, the offset database can be accessed to acquire the offset amount, which is associated with the target feature in the offset database (614). This offset amount can be applied to (i.e., added to) the actual parameter value in order to acquire an adjusted parameter value (616). For example, if the target feature is feature #4, the offset amount will decrease the parameter value and, if the target feature is feature #26, the offset amount will increase the parameter value.

The adjusted parameter value acquired at process 616 can subsequently be compared to a target parameter value (618). As mentioned above, the term "target parameter value" refers to a design goal for the features in the pattern and, more particularly, is a desired value for the parameter at issue in all of the multiple instances of the same feature in the pattern. Typically, this design goal is set to ensure optimum performance and/or to avoid fails in the integrated circuit structures being formed. The target parameter value can be, for example, a design-specified value for a critical dimension (e.g., a design-specified minimum width) for the features in the pattern. Depending upon the difference between the two values, APC can be performed. That is, depending upon the difference between the adjusted parameter value for the target feature and the target parameter value for all of the features in the pattern, at least one of the photolithography process specifications in the initial set of photolithography process specifications can be adjusted in order to generate an adjusted set of process specifications (619).

It should be noted that the purpose of adjusting the photolithography specification(s) is so that, when this particular photolithography process is subsequently performed at process 620 on another region of the same semiconductor wafer or on a different semiconductor wafer using the same specific reticle, the target parameter value is more likely to be achieved across the features in the resulting pattern. Specifically, the photolithography process specifications can include, but are not limited to, exposure energy, exposure wavelength and lens aperture and any one or more of these specifications (i.e., exposure energy, exposure wavelength and/or lens aperture) can be selectively adjusted to increase or decrease the parameter values (e.g., the critical dimension values) of the features, as necessary, based on the difference between the adjusted parameter value (e.g., the adjusted critical dimension value) and the target parameter value (e.g., the target critical dimension value) for the features. For example, consider a particular photolithography process that uses a positive tone photoresist to create a pattern of contact openings (e.g., as in FIGS. 4A-4B), a pattern of trenches or the like. When the adjusted critical dimension value is smaller than the target critical dimension value, the exposure energy can be increased to increase the sizes of the exposed areas that are selectively removed and, thereby the critical dimension across the features. However, when the adjusted critical dimension value is larger than the target critical dimension value, the exposure energy can be decreased to decrease the sizes of the exposed areas that are selectively removed and, thereby the critical dimension across the features. Those skilled in the art would recognize that the necessary adjustments to the specification would be different and, particularly, would be the reverse in the case of a particular photolithography process that uses a negative tone photoresist. In any case, this adjusted set of photolithography process specifications can subsequently be used when the same particular photolithography process is repeated on another region of the semiconductor wafer or on another semiconductor wafer using the same specific reticle (620).

As mentioned above, the purpose of adjusting the photolithography process specification(s) at process 619 is so that, when this particular photolithography process is subsequently performed at process 620 on another region of the same semiconductor wafer or on a different semiconductor wafer using the same specific reticle, the target parameter value (e.g., the target critical dimension) is more likely to be achieved across the features in the resulting pattern. Since the offset amount of the target feature is predetermined based on the average parameter value for the distribution of parameter values for all the features in the pattern, the adjusted parameter value better represents the majority of features and, as a result, APC performed based on the adjusted parameter value effectively minimizes overcorrections and, thereby dimension variations when the particular photolithography process is repeated at process 620. That is, with the disclosed APC method, dimension variations are minimized from pattern to pattern each time the same pattern is generated on another region of the semiconductor wafer or on a different semiconductor wafer using this particular photolithography process.

Figure 9:
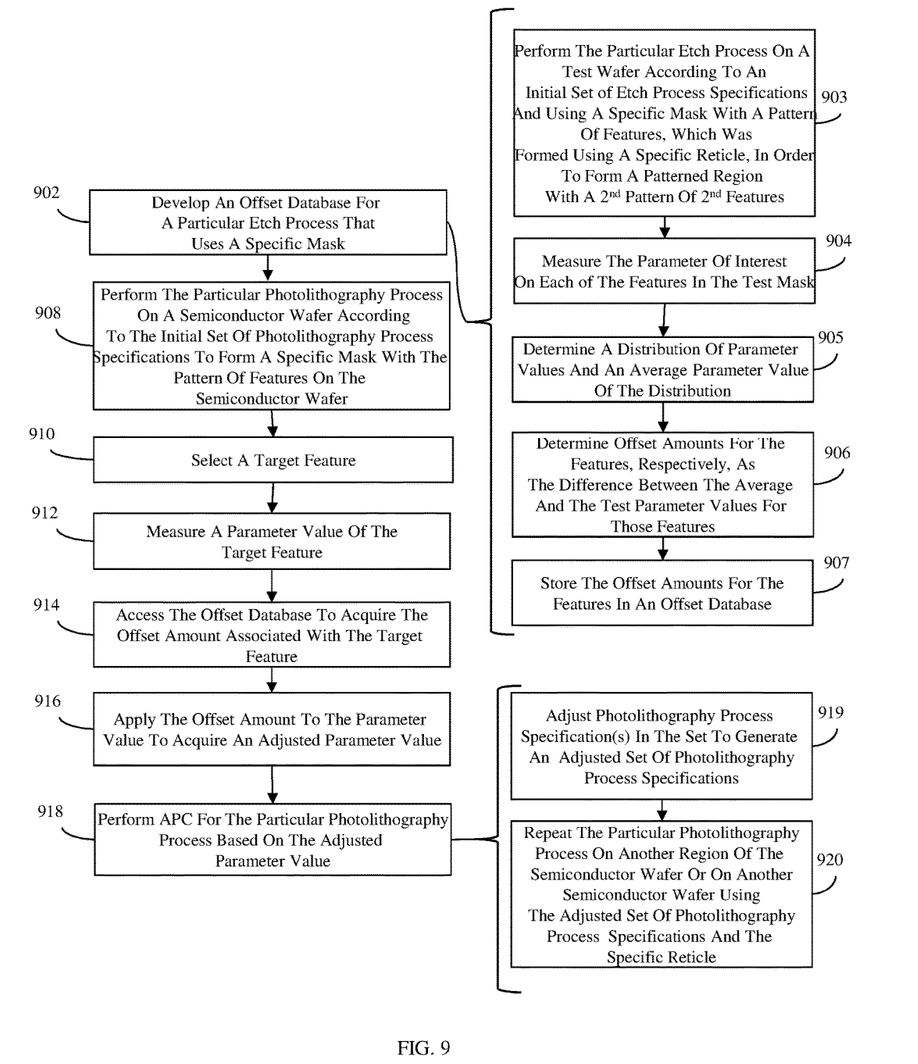
FIG. 9 is a flow diagram illustrating a disclosed method of advanced process control (APC) for a particular etch process.

Referring to FIG. 9, also disclosed herein is a method of APC for a particular etch process. This method of APC for a particular etch process can be a follow-on method to the above-described method of APC for a particular photolithography process or a standalone method.

In any case, in this method, an etch process offset database can be developed (902).

Figure 10:
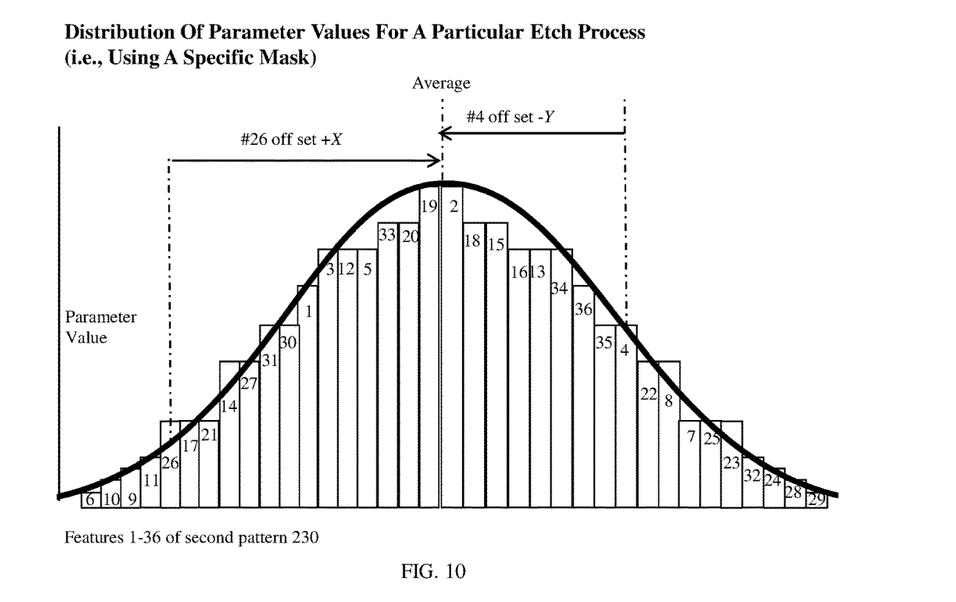
FIG. 10 is a graph illustrating a distribution of parameter values for the particular etch process as an average parameter value for the distribution.

To develop the etch process offset database, the particular etch process (e.g., a dry etch process, a wet etch process, etc.) can be performed on a test wafer using a test mask and according to an initial set of etch process specifications (including, for example, specifications for etch chemistry, etch duration, working pressure (if necessary), etc.) (903). Specifically, the test mask can have been previously formed in a photoresist layer on the test wafer using a specific reticle so that it has a pattern of features (e.g., as discussed in detail above with regard to the photolithography process). The particular etch process can be performed in order to transfer the pattern of features from the test mask into a test region of the test wafer below the test mask, thereby forming a patterned test region with a second pattern of second features. Then, the parameter at issue can be measured on each of the second features of the patterned test region in order to acquire test parameter values for all of the second features (904). The parameter at issue can be, for example, a dimension (e.g., width, depth, height, etc.) of the etched features. The dimension can, for example, be a critical dimension such as a minimum feature size (e.g., minimum width). The test parameter values can be the measured values of this dimension on each of the features in the pattern. It should be understood that the target parameter value for the patterned features in the test mask created by the photolithography process using the specific reticle may be either the same as or different from the target parameter value for the patterned second features created by the etch process using the specific mask. In any case, based on the test parameter values of the second features, a distribution of parameter values for all the second features in the second pattern, as well as an average parameter value for this distribution, can be determined, as shown in FIG. 10 (905). As mentioned above, for purposes of this disclosure the term "average" refers to any statistical central tendency values, such as a mean, median or mode. Offset amounts for each of the second features in the second pattern (which was created by the particular etch process using the specific mask that was created using a specific reticle) can be determined as the differences between the average parameter value and the test parameter values for those second features, respectively (906). Thus, the offset amount will be a negative amount, when the average parameter value is less than the test parameter value (e.g., see the −Y offset for feature #4) and, the offset amount will be a positive amount, when the average parameter value is greater than the test parameter value (e.g., see the +X offset for feature #26). Alternatively, the above-described processes can be performed with respect to multiple test regions (e.g., 2, 3, 4, etc.). In this case, a feature-specific average test parameter value can be found for each second feature 1-36 across the different test regions; an overall distribution of parameter values for all of the second features, as well as an average parameter value for the overall distribution, can be determined based on the feature-specific average test parameter values for the second features; and the offset amounts can be determined as the differences between the average parameter value for the overall distribution and the feature-specific average test parameter values for the second features, respectively.

Figure 11:
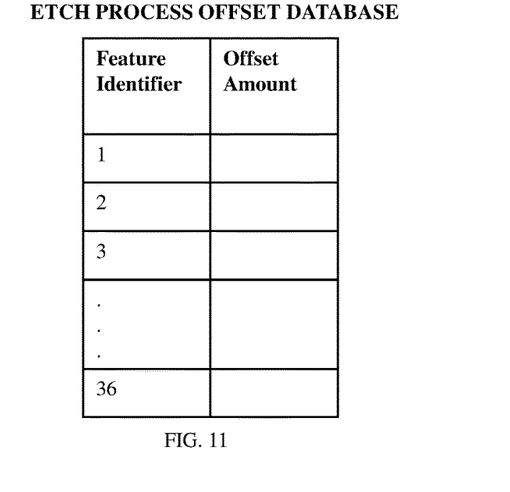
FIG. 11 is a table showing a photolithography process offset database.

The offset amounts for each of the second features in the second pattern (which was created by the particular etch process using the specific mask that was created using a specific reticle) can be stored in an etch process offset database that resides, for example, in a memory accessible by a processor of a computer system (907). As shown in FIG. 11, this etch process offset database can list the second features by identifiers (e.g., by number, by coordinates associated with the process field or other suitable identifiers) and can indicate the corresponding offset amount for each second feature.

Such an offset database can be accessible for use in APC control for the particular etch process, as described below. That is, manufacture of semiconductor wafers according to a given design can be initiated and can require performance of the particular etch process (908). Specifically, the particular etch process can be performed using the same initial set of etch process specifications (including, but not limited to, the same specifications for etch chemistry, etch duration, working pressure (if necessary), etc.) and a specific mask (which was created using the same specific reticle that was used to form the test mask that was, in turn, used to develop the etch process offset database). This particular etch process can result in the formation, on the semiconductor wafer, of a patterned region with the same second pattern of second features.

Once the patterned region is formed on the semiconductor wafer, a single second feature (referred to as a target second feature) can be selected from amongst all the second features in the second pattern of the patterned region (910). Next, the parameter of interest can be measured from the target second feature in order to acquire an actual parameter value (912). As illustrated in FIG. 10, the test parameter value of second features #26 and #4 were significantly different from the average parameter value. Thus, if APC for the etch process was performed based on the actual parameter value measured from either of these second features, overcorrection would occur in a significant number of the features. Specifically, second feature #4 is relatively large and second feature #26 is relatively small and, thus, neither of these second features are representative of the majority of the second features. If one or more of the etch process specification(s) were adjusted during APC to decrease the feature size based on the actual parameter measured from second feature #4, significant overcorrection would occur in the other second features, resulting in a majority of the second features being too small. Contrarily, if one or more of the etch process specification(s) were adjusted during APC to increase the feature size based on the actual parameter measured from second feature #26, significant overcorrection would occur in the other second features, resulting in a majority of the second features being too large. Therefore, in the method disclosed herein, once the actual parameter value of the target second feature is found, the etch process offset database can be accessed to acquire the offset amount, which is associated with the target second feature in the etch process offset database (914). This offset amount can be applied to (i.e., added to) the actual parameter value in order to acquire an adjusted parameter value (916). For example, if the target second feature is second feature #4, the offset amount will decrease the parameter value and, if the target second feature is second feature #26, the offset amount will increase the parameter value.

The adjusted parameter value acquired at process 916 can subsequently be compared to a target parameter value (e.g., a target critical dimension such as a target width) for all of the second features and, depending upon the difference between the two values, APC can be performed (918). That is, depending upon the difference between the adjusted parameter value for the target second feature and the target parameter value for all of the second features in the second pattern, at least one of the etch process specifications in the initial set of etch process specifications can be adjusted in order to generate an adjusted set of process specifications (919).

It should be noted that the purpose of adjusting the etch specification(s) is so that, when this particular etch process is subsequently performed at process 920 on another region of the same semiconductor wafer or on a different semiconductor wafer using a mask created from the same specific reticle, the target parameter value is more likely to be achieved across the features in the resulting pattern. Specifically, the etch process specifications can include, but are not limited to, etch chemistry, etch duration, working pressure and any one or more of these specifications can be selectively adjusted to increase or decrease the parameter values (e.g., the critical dimension values) of the second features, as necessary, based on the difference between the adjusted parameter value (e.g., the adjusted critical dimension value) and the target parameter value (e.g., the target critical dimension value) for the second features. For example, when the adjusted critical dimension value is smaller than the target critical dimension value, the etch duration can be increased to increase the critical dimension across the features; whereas, when the adjusted critical dimension value is larger than the target critical dimension value, the etch duration can be decreased. This adjusted set of etch process specifications can subsequently be used when the same particular etch process is repeated on another region of the semiconductor wafer or on another semiconductor wafer using the same specific reticle (920).

As mentioned above, the purpose of adjusting the etch process specification(s) at process 919 is so that, when this particular etch process is subsequently performed at process

920 on another region of the same semiconductor wafer or on a different semiconductor wafer using a specific mask created using the same specific reticle, the target parameter value (e.g., the target critical dimension) is more likely to be achieved across the second features in the resulting second pattern. Since the offset amount of the target second feature is predetermined based on the average parameter value for the distribution of parameter values for all the second features in the second pattern, the adjusted parameter value better represents the majority of second features and, as a result, APC performed based on the adjusted parameter value effectively minimizes overcorrections and, thereby dimension variations when the particular etch process is repeated at process 920. That is, with the disclosed APC method, dimension variations are minimized from pattern to pattern each time the same pattern is generated on another region of the same semiconductor wafer or on a different semiconductor wafer using the particular etch process.

Aspects of the methods described above may be implemented using a computer system and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may incorporate copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the methods disclosed herein are described above with reference to flowchart illustrations and/or block diagrams. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein is an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 12:
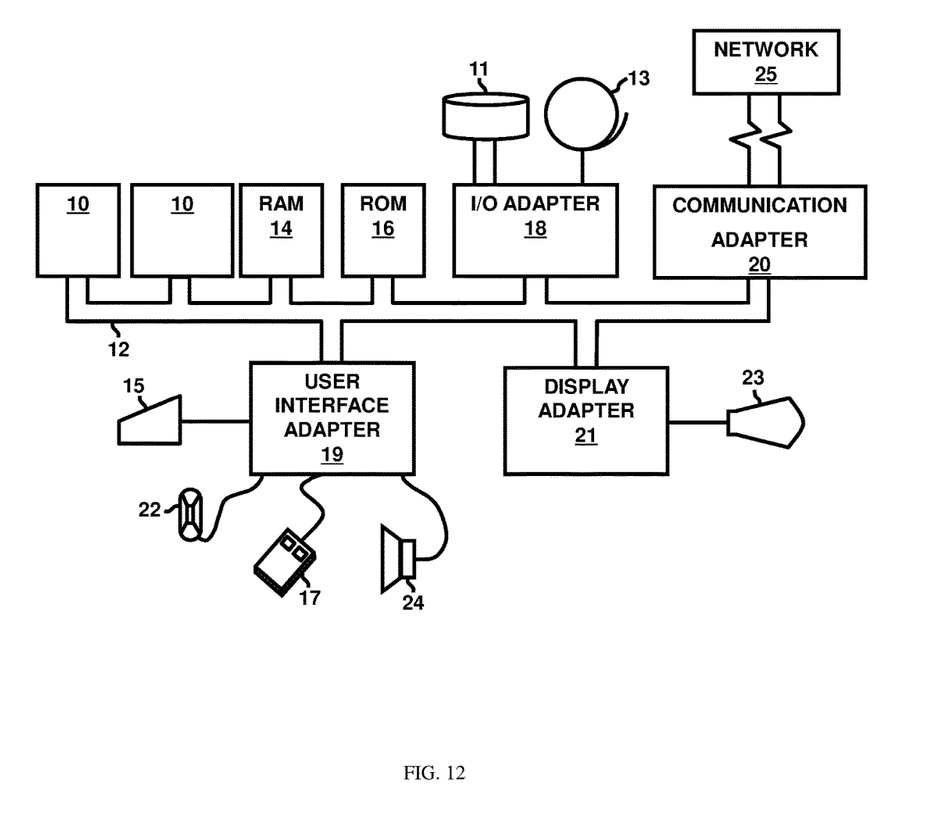
FIG. 12 is an exemplary hardware configuration for implementing aspects of the disclosed methods.

A representative hardware environment (i.e., a computer system) for implementing aspects of the disclosed methods is depicted in FIG. 12. This schematic drawing illustrates a hardware configuration of an information handling/computer system in accordance with the embodiments herein. The system includes, but is not limited to, at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are methods of advanced process control (APC) for particular processes (e.g., photolithography and/or etch processes). In these methods, a particular process (e.g., a photolithography process, an etch process, etc.) can be performed on a semiconductor wafer according to an initial set of process specifications in order to create a pattern of features. A parameter of interest can be measured on a target feature selected from amongst the features in the pattern and the value of the parameter can be used for APC (i.e., for adjusting in-line process controls). However, instead of performing APC based directly on the actual parameter value, APC can be performed using an adjusted parameter value. Specifically, an offset amount can be applied to the actual parameter value of the target feature in order to acquire an adjusted parameter value. This offset amount can be an amount previously determined based on an average of a known distribution of parameter values across all of the features in the pattern such that the adjusted parameter value better represents the majority of the features in the pattern. Performing APC using such an adjusted parameter value effectively minimizes dimension variations the particular process is subsequently performed on another region of the same semiconductor wafer or on another semiconductor wafer.

What is claimed is:

1. A method comprising:
    performing a process on a semiconductor wafer according to an initial set of process specifications, the process being performed to form a patterned region with a pattern of features;
    measuring a parameter of a target feature in the pattern to acquire a parameter value, the target feature being selected from amongst all the features in the pattern;
    accessing an offset database to acquire an offset amount that is associated in the offset database with the target feature;
    applying the offset amount to the parameter value to acquire an adjusted parameter value;
    based on a difference between the adjusted parameter value and a target parameter value for the features, adjusting at least one of the process specifications in the initial set of process specifications to generate an adjusted set of process specifications; and,
    repeating the process either on a different region of the semiconductor wafer or on a different semiconductor wafer according to the adjusted set of process specifications to form a second patterned region with the pattern of the features,
    wherein, during the repeating, the adjusted set of process specifications is used to minimize variations between the target parameter value and actual parameter values of features in the pattern of features in the second patterned region, and
    wherein the target parameter value is a design goal set to at least one of achieve optimal performance in integrated circuit structures being formed using the process and avoid fails in the integrated circuit structures being formed using the process.

2. The method of claim 1, wherein the parameter is a dimension, the parameter value is a measurement of the dimension, and the target parameter value is a design-specified value for the dimension.

3. The method of claim 1, further comprising, before the performing of the process, developing the offset database, wherein the developing of the offset database comprises:
- performing the process on a test wafer according to the initial set of process specifications so as to form a test region with the pattern of features;
- measuring the parameter on each of the features in the test region to acquire test parameter values for all of the features;
- based on the test parameter values, determining a distribution of parameter values and an average parameter value for the distribution;
- determining offset amounts between the average parameter value and each of the test parameter values; and,
- storing the offset amounts in the offset database.

4. The method of claim 1, wherein the process comprises a photolithography process.

5. The method of claim 1, wherein the process comprises an etch process.

6. A method comprising:
- performing a photolithography process on a semiconductor wafer using a specific reticle and according to an initial set of photolithography specifications, the photolithography process being performed to form, from a photoresist layer, a mask with a pattern of features;
- measuring a parameter of a target feature in the pattern to acquire a parameter value, the target feature being selected from amongst all of the features in the pattern;
- accessing a photolithography process offset database to acquire an offset amount that is associated with the target feature in the offset database;
- applying the offset amount to the parameter value to acquire an adjusted parameter value;
- based on a difference between the adjusted parameter value and a target parameter value for the features, adjusting at least one of the photolithography specifications in the initial set to generate an adjusted set of photolithography specifications; and,
- repeating the photolithography process either on a different region of the semiconductor wafer or on a different semiconductor wafer according to the adjusted set of photolithography specifications to form a second mask with the pattern of the features,
- wherein, during the repeating, the adjusted set of photolithography specifications is used to minimize variations between the target parameter value and actual parameter values of features in the pattern of features in the second mask, and
- wherein the target parameter value is a design goal set to at least one of achieve optimal performance in integrated circuit structures being formed using the photolithography process and avoid fails in the integrated circuit structures being formed using the photolithography process.

7. The method of claim 6, wherein the parameter is a dimension, the parameter value is a measurement of the dimension, and the target parameter value is a design-specified value for the dimension.

8. The method of claim 6, wherein the parameter is a minimum width, the parameter value is a width measurement, and the target parameter value is a design-specified value for the minimum width.

9. The method of claim 6, wherein the at least one of the photolithography specifications comprises exposure energy.

10. The method of claim 6, wherein the at least one of the photolithography specifications comprises any of exposure wavelength and lens aperture.

11. The method of claim 6, further comprising, before the performing the photolithography process, developing the offset database, wherein the developing of the photolithography process offset database comprises:
- performing the photolithography process on a test wafer using the specific reticle and according to the initial set of photolithography specifications in order to form, from a test photoresist layer, a test mask with the pattern of features;
- measuring the parameter on each of the features in the test mask to acquire test parameter values for all of the features;
- based on the test parameter values, determining a distribution of parameter values and an average parameter value for the distribution;
- determining offset amounts between the average parameter value and each of the test parameter values; and,
- storing the offset amounts in the photolithography process offset database.

12. The method of claim 6, the method further comprising:
- performing an etch process using an initial set of etch specifications and the mask to transfer the pattern of features from the mask into a region of the semiconductor wafer below the mask to form a patterned region with a second pattern of second features;
- measuring a second parameter of a second target feature in the second pattern to acquire a second parameter value, the second target feature being selected from amongst all the second features in the second pattern;
- accessing an etch process offset database to acquire a second offset amount associated in the etch process offset database with the second target feature;
- applying the second offset amount to the second parameter value to acquire an adjusted second parameter value; and
- based on a difference between the adjusted second parameter value and a second target parameter value for the second features, adjusting at least one of the etch specifications in the initial set of etch specifications to generate an adjusted set of etch specifications.

13. The method of claim 12, further comprising repeating the photolithography process and the etch process on either a different region of the semiconductor wafer or a different semiconductor wafer using the adjusted set of photolithography specifications and the adjusted set of etch specifications, respectively.

14. A method comprising:
- performing an etch process on a semiconductor wafer using a mask and according to an initial set of etch specifications, the mask being formed using a specific reticle so as to have a pattern of features and the etch process being performed to transfer the pattern of features from the mask into a region below the mask to form a patterned region with a second pattern of second features;
- measuring a parameter of a target second feature in the second pattern to acquire a parameter value, the target second feature being selected from amongst the second features in the second pattern;
- accessing an etch process offset database to acquire an offset amount associated with the target second feature in the etch process offset database;
- applying the offset amount to the parameter value to acquire an adjusted parameter value;
- based on a difference between the adjusted parameter value and a target parameter value for the second features, adjusting at least one of the etch specifications in the initial set of etch specifications to generate an adjusted set of etch specifications; and, repeating the etch process either on a different region of the semiconductor wafer or on a different semiconductor wafer according to the adjusted set of etch specifications to form a second patterned region with the second pattern of second features, wherein, during the repeating, the adjusted set of etch specifications is used to minimize variations between the target parameter value and actual parameter values of second features in the second pattern of second features in the second patterned region, and wherein the target parameter value is a design goal set to at least one of achieve optimal performance in integrated circuit structures being formed using the etch process and avoid fails in the integrated circuit structures being formed using the etch process.

15. The method of claim 14, wherein the parameter is dimension, the parameter value is a measurement of the dimension, and the target parameter value is a design-specified value for the dimension.

16. The method of claim 14, wherein the parameter is a minimum width, the parameter value is a width measurement, and the target parameter value is a design-specified value for the minimum width.

17. The method of claim 14, further comprising, before the performing of the etch process, developing the offset database, wherein the developing of the etch process offset database comprises:

performing the etch process on a test wafer using a test mask and according to the initial set of etch specifications, the test mask being formed using the specific reticle so as to have the pattern of features and the etch process being performed to transfer the pattern of features from the test mask into a test region of the test wafer below the test mask to form a patterned test region with the second pattern of second features;

measuring the parameter on each of the second features in the patterned test region to acquire test parameter values;

based on the test parameter values, determining a distribution of parameter values and an average parameter value for the distribution;

determining offset amounts between the average parameter value and each of the test parameter values; and, storing the offset amounts in the etch process offset database.

* * * * *